US011031256B2

(12) United States Patent
Huemoeller et al.

(10) Patent No.: US 11,031,256 B2
(45) Date of Patent: Jun. 8, 2021

(54) SEMICONDUCTOR DEVICE WITH TIERED PILLAR AND MANUFACTURING METHOD THEREOF

(71) Applicant: Amkor Technology Singapore Holding Pte. Ltd., Singapore (SG)

(72) Inventors: Ronald Patrick Huemoeller, Gilbert, AZ (US); Michael G. Kelly, Queen Creek, AZ (US); Curtis Zwenger, Chandler, AZ (US)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 16/887,590

(22) Filed: May 29, 2020

(65) Prior Publication Data

US 2020/0294815 A1   Sep. 17, 2020

Related U.S. Application Data

(63) Continuation of application No. 16/378,741, filed on Apr. 9, 2019, now Pat. No. 10,748,786, which is a
(Continued)

(51) Int. Cl.
*H01L 23/48* (2006.01)
*H01L 23/52* (2006.01)
(Continued)

(52) U.S. Cl.
CPC ........ *H01L 21/4857* (2013.01); *H01L 21/486* (2013.01); *H01L 21/4853* (2013.01);
(Continued)

(58) Field of Classification Search
CPC ....... H01L 2224/73265; H01L 2224/97; H01L 2224/96; H01L 2224/16145;
(Continued)

(56) References Cited

U.S. PATENT DOCUMENTS 8,742,579 B2 * 6/2014 Pagaila ................... H01L 24/18
257/741
8,901,726 B2 * 12/2014 Lin ....................... H05K 3/4015
257/686
(Continued)

FOREIGN PATENT DOCUMENTS

CN       200510099769       8/2008

*Primary Examiner* — S. V. Clark
(74) *Attorney, Agent, or Firm* — McAndrews, Held & Malloy, Ltd.

(57) ABSTRACT

A semiconductor device having one or more tiered pillars and methods of manufacturing such a semiconductor device are disclosed. The semiconductor device may include redistribution layers, a semiconductor die, and a plurality of interconnection structures that operatively couple a bottom surface of the semiconductor die to the redistribution layers. The semiconductor device may further include one or more conductive pillars about a periphery of the semiconductor die. The one or more conductive pillars may be electrically connected to the redistribution layers and may each comprise a plurality of stacked tiers.

19 Claims, 6 Drawing Sheets

Related U.S. Application Data continuation of application No. 15/467,794, filed on Mar. 23, 2017, now Pat. No. 10,256,114.

(51) Int. Cl.

| | |
|---|---|
| *H01L 29/40* | (2006.01) |
| *H01L 21/48* | (2006.01) |
| *H01L 23/00* | (2006.01) |
| *H01L 21/56* | (2006.01) |
| *H01L 25/00* | (2006.01) |
| *H01L 23/538* | (2006.01) |
| *H01L 23/31* | (2006.01) |
| *H01L 25/10* | (2006.01) |
| *H01L 21/683* | (2006.01) |

(52) U.S. Cl.
CPC ............ *H01L 21/56* (2013.01); *H01L 21/563* (2013.01); *H01L 21/565* (2013.01); *H01L 21/6835* (2013.01); *H01L 23/3135* (2013.01); *H01L 23/3185* (2013.01); *H01L 23/5383* (2013.01); *H01L 23/5384* (2013.01); *H01L 23/5385* (2013.01); *H01L 23/5386* (2013.01); *H01L 23/5389* (2013.01); *H01L 24/16* (2013.01); *H01L 25/105* (2013.01); *H01L 25/50* (2013.01); *H01L 23/3128* (2013.01); *H01L 2221/68359* (2013.01); *H01L 2224/16227* (2013.01); *H01L 2224/32225* (2013.01); *H01L 2224/73204* (2013.01); *H01L 2224/81005* (2013.01); *H01L 2224/92125* (2013.01); *H01L 2225/1023* (2013.01); *H01L 2225/1035* (2013.01); *H01L 2225/1041* (2013.01); *H01L 2225/1058* (2013.01); *H01L 2924/15311* (2013.01)

(58) Field of Classification Search
CPC ............. H01L 25/0657; H01L 25/0652; H01L 21/486; H01L 24/83; H01L 23/5226; H01L 24/96; H01L 25/043
USPC ........ 257/686, 777, 778; 438/107, 108, 109, 438/110
See application file for complete search history.

(56) References Cited

U.S. PATENT DOCUMENTS

| | | | |
|---|---|---|---|
| 8,901,748 B2* | 12/2014 | Manusharow | H01L 24/20 257/777 |
| 8,922,005 B2* | 12/2014 | Hu | H01L 24/20 257/737 |
| 9,449,953 B1* | 9/2016 | Shih | H01L 25/50 |
| 9,761,534 B2 | 9/2017 | Hsu et al. | |
| 9,941,207 B2 | 4/2018 | Lin | |
| 9,960,328 B2 | 5/2018 | Clark et al. | |
| 2011/0133325 A1* | 6/2011 | Moon | H01L 23/3128 257/686 |
| 2012/0153467 A1 | 6/2012 | Chi et al. | |
| 2013/0270699 A1 | 10/2013 | Kuo et al. | |
| 2017/0243826 A1 | 8/2017 | Lin et al. | |
| 2018/0068937 A1* | 3/2018 | Marimuthu | H01L 23/3128 |
| 2018/0190581 A1* | 7/2018 | Lin | H01L 21/76895 |
| 2018/0247916 A1* | 8/2018 | Lee | H01L 25/50 |
| 2019/0206799 A1* | 7/2019 | Keser | H01L 21/6836 |

\* cited by examiner

SEMICONDUCTOR DEVICE WITH TIERED PILLAR AND MANUFACTURING METHOD THEREOF

BACKGROUND

Present semiconductor packages and methods for forming semiconductor packages are inadequate, for example resulting in excess cost, decreased reliability, or package sizes that are too large. For example, conventional techniques may form a copper pillar by etching a hole in a resist layer and filling the hole with copper to form the copper pillar. Such conventional techniques are commonly limited to an aspect ratio (a height to width ratio) of about 2:1. One factor limiting such conventional techniques from obtaining greater aspect ratios is that as the depth of the etched hole increases, the more difficult it becomes to completely fill the hole with copper.

Further limitations and disadvantages of conventional and traditional approaches will become apparent to one of skill in the art, through comparison of such approaches with the present disclosure as set forth in the remainder of the present application with reference to the drawings.

SUMMARY

Figure 1:
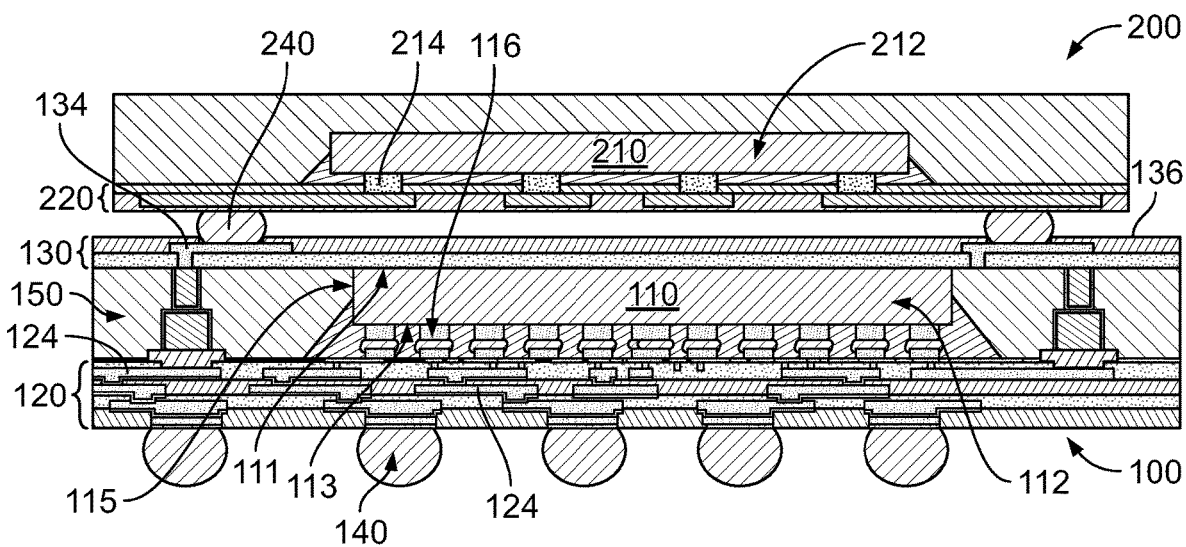
FIG. 1 shows a cross-sectional view of a first semiconductor device with a tiered pillar and a second semiconductor device operatively stacked upon the first semiconductor device in accordance with various aspects of the present disclosure.

Various aspects of this disclosure provide a method for manufacturing a semiconductor device and a semiconductor device produced thereby. For example and without limitation, various aspects of this disclosure are directed to a semiconductor device comprising a tiered pillar a method for manufacturing such a semiconductor device.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements through the discussions of various examples.

The discussion will now refer to various example illustrations provided to enhance the understanding of the various aspects of the present disclosure. It should be understood that the scope of this disclosure is not limited by the specific characteristics of the examples provided and discussed herein.

A cross-sectional view depicting a first semiconductor device 100 and second semiconductor device 200 is shown in FIG. 1. More specifically, FIG. 1 depicts the second semiconductor device 200 stacked upon the first semiconductor device 100. The first semiconductor device 100 may include a first semiconductor die 110, a lower or first interposer 120, an upper or second interposer 130, interconnection structures 140, and tiered pillars 150. The first semiconductor die 110 may include one or more integrated circuit components 112 electrically coupled to one or more conductive bumps 116 of the first semiconductor die 110. Moreover, the first semiconductor die 110 may have a top surface 111, a bottom surface 113 parallel to the top surface 111, and one or more side surfaces or walls 115 adjoining the top surface 111 to the bottom surface 113.

The lower interposer 120 may include one or more redistribution layers 124 which operatively couple the bumps 116 of the first semiconductor die 110 to the one or more interconnection structures 140. In this manner, the integrated circuit components 112 of the first semiconductor die 110 may be operatively coupled to the one or more interconnection structures 140 via the lower interposer 120.

The upper interposer 130 may be positioned above or on the top surface 111 of the semiconductor die 110 such that the semiconductor die 110 is disposed between the lower interposer 120 and the upper interposer 130. The upper interposer 130 may be operatively coupled to the lower interposer 120 via one or more tiered pillars 150 positioned peripherally beyond the side walls 115 of the semiconductor die 110. The redistribution layers 124 of the lower interposer 120 may further operatively couple the upper interposer 130 to the one or more interconnection structures 140 via the tiered pillars 150.

The upper interposer 130 may further include one or more pads or landings 134 on an upper surface 136 of the upper interposer 130. Such pads 134 may provide electrical connections for operatively coupling additional electrical components such as the second semiconductor device 200 to the interconnection structures 140 via the upper interposer 130 and the tiered pillars 150.

As shown, the second semiconductor device 200 may include a second semiconductor die 210, an interposer 220, and interconnection structures 240. The second semiconductor die 210 may include one or more integrated circuit components 212 which are be operatively coupled to the interposer 220 via one or more micro-bumps 214 of the second semiconductor die 210. The interposer 220 may include one or more redistribution layers 224 which operatively couple the micro-bumps 214 to the one or more interconnection structures 240. In this manner, the integrated circuit components 212 of the second semiconductor die 210 may be operatively coupled to the one or more interconnection structures 240 via the interposer 220.

Moreover, the second semiconductor device 200 may be stacked upon the first semiconductor device 100 such that the one or more interconnection structures 240 are affixed to the one or more pads or landings 134 on the upper surface 136 of the first semiconductor device 100. In this manner, the integrated circuit components 212 of the second semiconductor device 200 may be operatively coupled to the interconnection structures 140 of the first semiconductor device 100 via the upper interposer 130 and the tiered pillars 150 of the first semiconductor device 100.

The semiconductor dies 110, 210 may comprise any of a variety of types of semiconductor dies, non-limiting examples of which are provided herein. For example, the semiconductor dies 110, 210 may comprise a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. One or more passive electrical components may also be mounted instead of and/or in addition to the semiconductor dies 110, 210.

Figure 2:
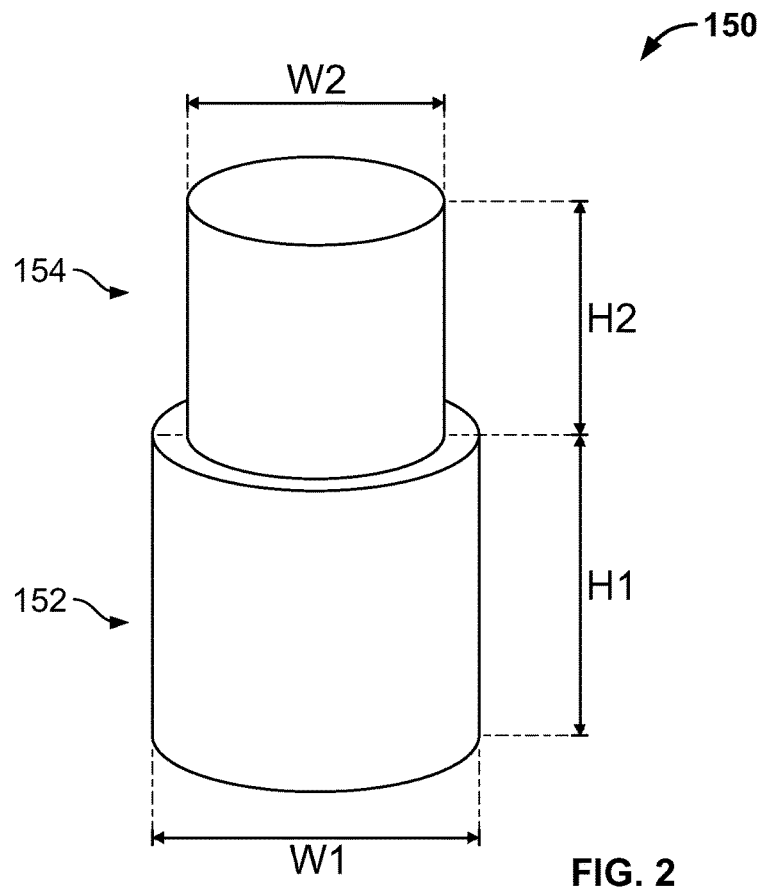
FIG. 2 shows a perspective view of the tiered pillar of FIG. 1 in accordance with various aspects of the present disclosure.

As shown in FIG. 1 and in greater detail in FIG. 2, the each pillar 150 in one embodiment includes two tiers 152, 154. However, embodiments in which the pillars 150 include more tiers (e.g., three, four, etc.) are envisioned. As shown, each pillar 150 includes a first tier 152 and a second tier 154 stacked upon the first tier 152. Moreover, the first tier 152 has a first width W1 that is greater than the second width W2 of the second tier 154. The differences in width between the first and second tiers 152, 154 may provide for greater tolerance during manufacturing.

In one embodiment, the first tier 152 is formed by etching or otherwise patterning a first resist layer to include a first hole and then filling the first hole with a conductive material such as Cu, Ni, Al, Au, Ag, Pd, etc. to form the first tier 152 of the pillar 150. In particular, the first hole may be filled via a copper plating process. After forming the first tier 152, a second resist layer may be formed over the first resist layer and first hole. The second resist layer may be etched or otherwise patterned to form a second hole over the filled first hole. The second hole may then be filled with conductive material such as Cu, Ni, Al, Au, Ag, Pd, etc. to form the second tier 154 of the pillar 150. In particular, the second hole may be filled using a copper plating process that uses the first tier 152 as a base.

During manufacture, there may be some misalignment between the location of the second hole with respect to the location of the first hole. Forming the width W1 of first hole larger than the width W2 of the second hole may provide greater tolerance for such misalignment. In particular, the second tier 154 despite some misalignment may still completely rest upon the first tier 152.

While the first tier 152 is shown with a width W1 that is larger than the width W2 of the second tier 152, in some embodiments the widths may be reversed with the first tier 152 having a smaller width than the second tier 152. In yet other embodiments, the first tier 152 and second tier 154 may be formed to have the same width. Finally, FIG. 2 depicts the tiers 152, 154 as a right circular cylinder. In some embodiments, the tiers 152, 154 may be formed as a right frustum in which either the base surface or top surface of the frustum is larger. While shown with a circular cross-section, the tiers 152, 154 in some embodiments may have non-circular cross sections (e.g., rectangular, square, elliptical, etc.). Moreover, the first tier 152 may have a cross section (e.g., square) that is different than the cross section (e.g., circular) of the second tier 154.

Figure 3A:
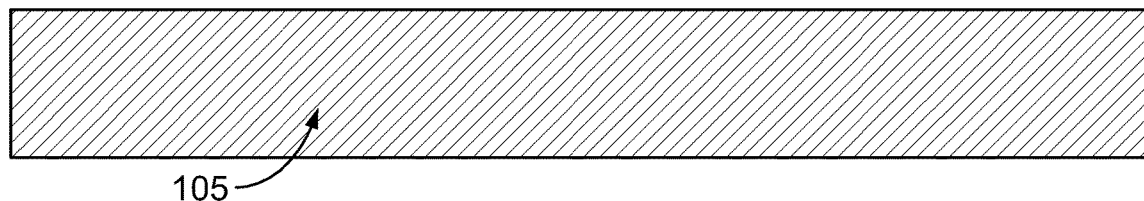
FIGS. 3A-3M show cross-sectional views illustrating a method of manufacturing the first semiconductor device and attaching the second semiconductor device thereto in accordance with various aspects of the present disclosure.

Referring to FIGS. 3A-3M, cross-sectional views illustrating a method of manufacturing the first semiconductor device 100 and stacking the second semiconductor device 200 thereon are shown in accordance with various aspects of the present disclosure. As shown in FIG. 3A, a carrier 105 may provide a planar top surface and a planar bottom surface. The carrier 105 may comprise any of a variety of different types of carrier materials. The carrier 105 may, for example, comprise a semiconductor material (e.g., silicon, GaAs, etc.), a glass material, a ceramic material, a metal material, etc. The carrier 105 may also comprise any of a variety of different types of configurations. For example, the carrier 105 may be in a mass form (e.g., a wafer form, a rectangular panel form, etc.). Also for example, the carrier 105 may be in a singular form (e.g., singulated from a wafer or panel, originally formed in a singular form, etc.).

Figure 3B:
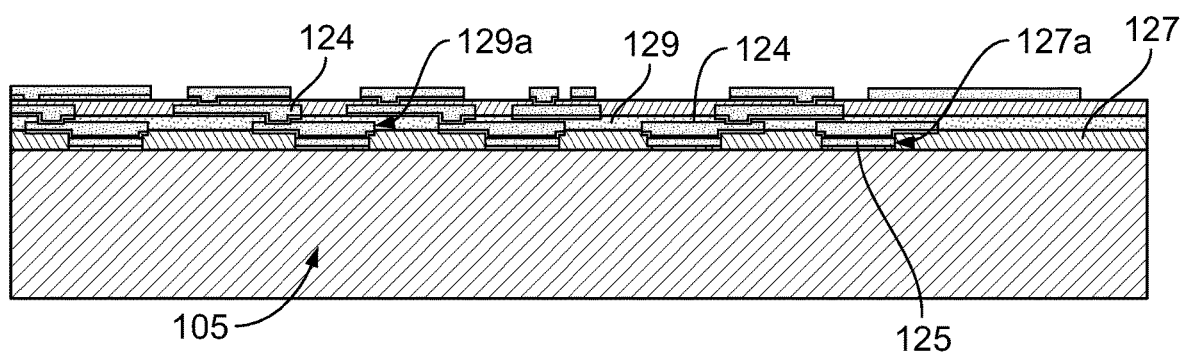

As shown in FIG. 3B, multiple redistribution layers 124 may be built upon the carrier 105. For example, an under bump metal (UBM) 125 of at least one layer may be directly formed on the carrier 105. In one example implementation, the under bump metal 125 may be formed of any of a variety of materials, non-limiting examples of which are presented herein. For example, the under bump metal 125 may be formed of at least one of chrome, nickel, palladium, gold, silver, alloys thereof, combinations thereof, equivalents thereof, etc. The under bump metal 125 may, for example, comprise Ni and Au. The under bump metal 125 may also, for example, comprise Cu, Ni, and Au. The under bump metal 125 may be also formed utilizing any of a variety of processes, non-limiting examples of which are presented herein. For example, the under bump metal 125 may be formed utilizing one or more of an electroless plating process, electroplating process, sputtering process, etc. on the carrier 105. The under bump metal 125 may, for example, prevent or inhibit the formation of an intermetallic compound at the interface between the conductive interconnection structure 140 and the first conductive layer 124, thereby improving the reliability of the connection to the conductive interconnection structure 140. The under bump metal 125 may comprise multiple layers on the carrier 105. For example, the under bump metal 125 may comprise a first layer of Ni and a second layer of Au.

The under bump metal 125 may then be covered with a first dielectric layer 127 such as an organic layer (e.g., polymers such as polyimide, Benzocyclobutene (BCB), Polybenzoxazole (PBO), equivalents thereof, combinations thereof, etc.), which may also be referred to as a passivation layer. For example, the first dielectric layer 127 may be formed on the under bump metal 125 and the top surface of the carrier 105. The first dielectric layer 127 may be formed utilizing one or more of spin coating, spray coating, dip coating, rod coating, equivalents thereof, combinations thereof, etc., but the scope of the present disclosure is not limited thereto. As an example, the first dielectric layer 127 may be formed by laminating a dry film.

An opening 127a (or aperture) may, for example, be formed in the first dielectric layer 127, and a specific area of the under bump metal 125 (e.g., the entire top surface, a portion of the top surface, a center region of the top surface, etc.) may be exposed through the opening 127a. The opening 127a may be formed in any of a variety of manners (e.g., mechanical and/or laser ablation, chemical etching, photolithography, etc.). The first dielectric layer 127 (or any dielectric layer discussed herein) may also be originally formed having opening 127a, for example by masking, or other selective dielectric layer formation process.

The first conductive layer or redistribution layer 124 may be formed on the under bump metal 125 and the first dielectric layer 127. For example, the first conductive layer 124 may be coupled to the under bump metal 125. In one example implementation, a seed layer may be formed on the under bump metal 125 and the first dielectric layer 127. The seed layer and/or any seed layer discussed herein may be formed of any of a variety of materials, including but not limited to tungsten, titanium, equivalents thereof, combinations thereof, alloys thereof, etc. The seed layer may be formed utilizing any of a variety of processes. For example, the seed layer may be formed utilizing one or more of an electroless plating process, an electrolytic plating process, a sputtering process, etc. For example, the seed layer may be formed of TiW with a Cu target. Also, any seed layer discussed herein may be formed utilizing the same or similar materials and/or processes, or may be formed utilizing different respective materials and/or processes. Additionally, the seed layer and/or any seed layer discussed herein may comprise multiple layers. As an example, the seed layer may comprise a first TiW layer and a second Cu layer.

The first conductive layer 124 may then be formed on the seed layer. The first conductive layer 124 and/or the forming thereof may, for example, share any or all characteristics with any other conductive layer and/or the forming thereof discussed herein. The first conductive layer 124 may be formed of any of a variety of materials. For example, the first conductive layer 124 may be formed of copper, aluminum, gold, silver, palladium, equivalents thereof, combinations thereof, alloys thereof, other conductive materials, etc.

The first conductive layer 124 may be formed utilizing any of a variety of processes. For example, the first conductive layer 124 may be formed utilizing one or more of an electroless plating process, an electrolytic plating process, a sputtering process, etc. The patterning or routing of the first conductive layer 124 may, for example, be accomplished utilizing any of a variety of processes. For example, the first conductive layer 124 may be patterned or routed utilizing a photoetching process using a photoresist, etc. For example, photoresist may be spin coated (or otherwise applied, such as a dry film, etc.) on a seed layer. The photoresist may then be set using, for example, a masking and illumination process. Then portions of the photoresist may be etched away, residual photoresist may be removed in a descum process, and drying (e.g., spin rinse drying) may be performed to form a template of photoresist. After forming the first conductive layer 124, the template may be stripped (e.g., chemically stripped, etc.), and the seed layer that is exposed from the first conductive layer 124 may be etched.

The first conductive layer 124 and/or any conductive layer discussed herein may also be referred to as a redistribution layer. Also, any conductive layer discussed herein may be formed utilizing the same or similar materials and/or processes, or may be formed utilizing different respective materials and/or processes. Additionally, the first conductive layer 124, and/or the forming thereof, may share any or all characteristics with any other conductive layer, and/or the forming thereof, disclosed herein.

The first conductive layer 124 may then be covered with a second dielectric layer 129. The second dielectric layer 129 may also be referred to as a passivation layer. The second dielectric layer 129 may be formed of any of a variety of materials. For example, the second dielectric layer 129 may be formed of an organic material (e.g., polymers such as polyimide, Benzocyclobutene (BCB), Polybenzoxazole (PBO), equivalents thereof, combinations thereof, etc.). Also for example, the second dielectric layer 129 may be formed of an inorganic material. The second dielectric layer 129 may be formed utilizing any of a variety of processes. For example, the second dielectric layer 129 may be formed utilizing one or more of spin coating, spray coating, dip coating, rod coating, equivalents thereof, combinations thereof, etc. The second dielectric layer 129 and/or any dielectric layer discussed herein may also be referred to as a passivation layer. Also, any dielectric layer discussed herein may be formed utilizing the same or similar materials and/or processes, or may be formed utilizing different respective materials and/or processes. Additionally, the second dielectric layer 129, and/or the forming thereof, may share any or all characteristics with any other dielectric layer, and/or the forming thereof, disclosed herein.

Figure 3C:
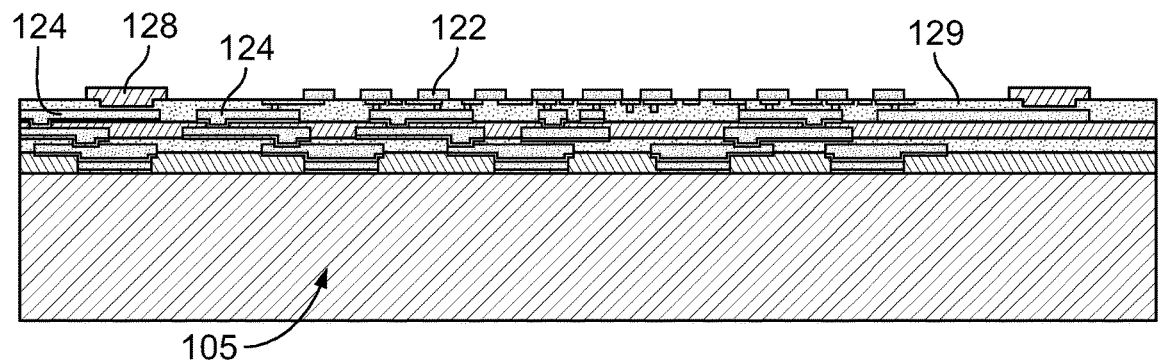

Formation of the first conductive layer 124, with or without a seed layer, and the second dielectric layer 129 may be repeated any number of times utilizing the same materials and/or processes or different respective materials and/or processes. The example illustrations in FIGS. 3B and 3C shows two formations of such layers. As such, the layers are provided with similar labels in the figures (e.g., repeating the first conductive layer 124 and the second dielectric layer 129).

Openings or apertures 129a may be formed in the second dielectric layer 129 at specific areas to expose the underlying first conductive layer 124. The openings 129a may be formed in any of a variety of manners (e.g., mechanical and/or laser ablation, chemical etching, photolithography, etc.). The second dielectric layer 129 (or any dielectric layer discussed herein) may also be originally formed having opening 129a by, for example, masking or another selective dielectric layer formation process.

For discussion purposes herein, the redistribution layers 124 and the dielectric layers 127, 129 may be considered to be components of an interposer 120. Furthermore, the under bump metal 125 and the pads 126 described herein may also be considered to be components of the interposer 120. The term "interposer" is used herein to refer to a general redistribution structure (e.g., a dielectric and conductor layered structure) that is interposed between other structures.

Moreover, the method of manufacturing depicted in FIGS. 3A-3M depicts the construction or build-up of interposer 120 on the carrier 105. However, in some embodiments, the interposer 120 may be implemented as a laminate substrate (e.g., a pre-fabricated printed-circuit board (PCB) supplied by a third party) or manufactured without the aid of a carrier 105. As such, some embodiments of the manufacturing method may lack a carrier 105 or may begin with a pre-fabricated interposer 120, thus effectively eliminated the process shown in FIGS. 3A and 3B.

As shown in FIG. 3C, a micro bump pads, other pads, landings, attachment structures, or die attachment structures 122 may be formed such that each pad 122 is electrically connected to an underlying redistribution layer 124. Similarly, each pillar pad or under bump metal 128 may be formed such that the pad 128 is electrically connected to an underlying redistribution layer 124. Such underlying redistribution layers 124 may provide a conductive path that electrically couples pads 128 and their pillars 150 to respective interconnection structures 140 or attachment structure 116 of the semiconductor die 110. (See, e.g., FIG. 1.) In an example implementation, each micro bump pad 122 has a diameter between 15 µm and 45 µm. Moreover, the micro bump pads 122 are arranged with a pitch between 50 µm and 150 µm. The pillar pads 128 may be formed with a diameter that is roughly 10% greater than the diameter of the first tiers 152 to be formed on the pillar pads 128. Thus, in one embodiment, each pillar pad 128 has a diameter between 55 µm and 165 µm. Further, in an example implementation, a seed layer may be formed over exposed portions of the underlying redistribution layers 124. The seed layer and/or the forming thereof may share any or all characteristics with any other seed layer (e.g., micro bump seed layer, etc.) and/or the forming thereof discussed herein.

Each pad 122, 128 may comprise any of a variety of materials, non-limiting examples of which are provided herein. For example, each pad 122, 128 may comprise copper, aluminum, gold, silver, palladium, general conductive material, conductive material, equivalents thereof, combinations thereof, alloys thereof, any conductive material discussed herein, etc. In an example implementation, each pad 122, 128 may comprise Ni and Au. In another example implementation, each pad 122, 128 may comprise Ni, Au, and Cu. Each pad 122, 128 may be formed utilizing any of a variety of processes, non-limiting examples of which are provided herein. For example, each pad 122, 128 may be formed utilizing one or more of an electroless plating process, an electrolytic plating process, a sputtering process, etc.

The pads 122, 128 are shown in FIG. 3C extending past (or protruding from) the top surface of the first dielectric layer 111, but the scope of this disclosure is not limited thereto. For example, the pads 122, 128 may comprise a top surface that is coplanar with the top surface of the uppermost dielectric layer 129, or may comprise a top surface that is below the top surface of the first dielectric layer 111. Though generally shown comprising a cylindrical shape, the pads 122, 124 may comprise any of a variety of geometric configurations (e.g., square, rectangular, elliptical, etc.).

Figure 3D:
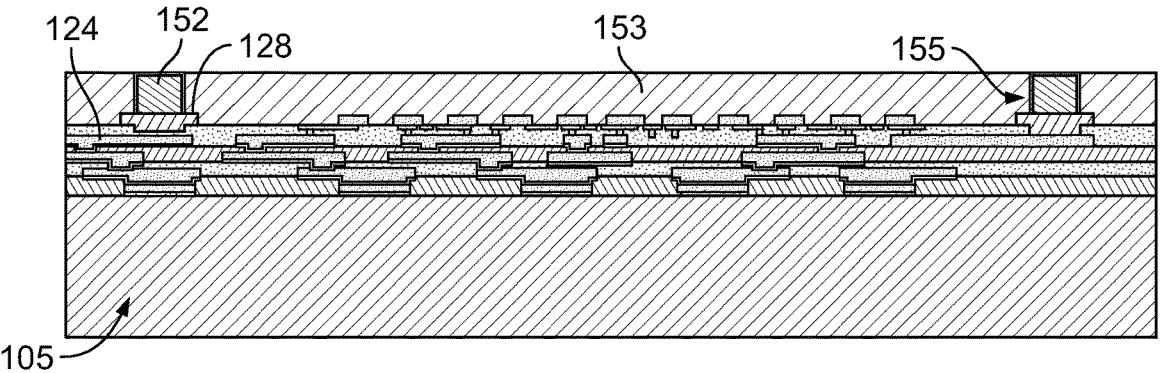

Referring now to FIG. 3D, first tiers 152 of tiered pillars 150 may be formed along the periphery to provide space between the pillars 150 for a later mounted semiconductor die 110. The first tiers 152 may be formed such that each of the first tiers 152 is electrically connected to one or more underlying pads 128.

A first resist layer 153 may then be formed over the micro bump pads 125 and pillar pads 128. First holes 155 may then be formed through the first resist layer 153 in any of a variety of manners (e.g., mechanical and/or laser ablation, chemical etching, photolithography, etc.). Each first hole 155 may be formed over a respective pad 128, thus exposing such pads 128. The first holes 155 may then be filled with conductive material (e.g., Cu, Ni, Al, Au, Ag, Pd, etc.) to form the first tiers 152 of the pillars 150. In particular, the first tiers 152 may be formed as a right circular cylinder. As explained above, the first tiers 152 in some embodiments may have non-circular cross sections. Moreover, in some embodiments, the first tiers 152 may be formed as a right frustum in which either the base surface or top surface is larger. In some embodiments, the first tiers 152 may have an aspect ratio greater than or equal to 1. Further, the first tiers 152 may have a base diameter or width W1 between 50 µm and 150 µm and a height H1 between 50 µm and 150 µm.

Figure 3E:
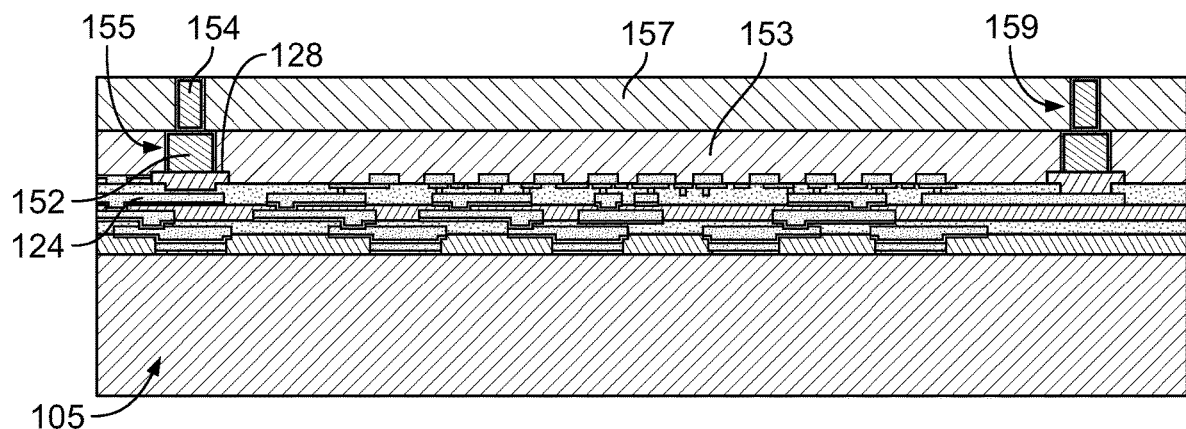

Referring now to FIG. 3E, second tiers 154 of tiered pillars 150 may be formed on first tiers 152. In particular, the second tiers 154 may be formed such that each of the second tiers 154 is electrically connected to one or more underlying redistribution layers 124 via a respective first tier 152. To this end, a second resist layer 157 may be formed over the first resist layer 153 and first tiers 152. Second holes 159 may then be formed through the second resist layer 157 in any of a variety of manners (e.g., mechanical and/or laser ablation, chemical etching, photolithography, etc.). Each second hole 159 may be formed over a respective first hole 153 and first tier 152, thus exposing such first tiers 152. The second holes 159 may then be filled with conductive material (e.g., Cu, Ni, Al, Au, Ag, Pd, etc.) to form the second tiers 154 of the pillars 150. In particular, the second tiers 154 may be formed as a right circular cylinder. As explained above, the second tiers 154 in some embodiments may have non-circular cross sections. Moreover, in some embodiments, the second tiers 154 may be formed as a right frustum in which either the base surface or top surface is larger.

In some embodiments, the second tiers 154 may have an aspect ratio greater than or equal to 1. Further, the second tiers 154 may have a base diameter or width W2 that is 90% or less than an upper diameter or width of the first tiers 152. Such smaller width W2 may result in the second tiers 154 being fully supported by the first tiers 152 even in the presence of some misalignment between the first and second tiers 152, 154. Furthermore, the second tiers 154 may have a height H2 between 50 µm and 150 µm.

The above tiered formation of the pillars 150 may effectively obtain aspect ratios that are twice that of conventional single tiered processes. For example, if a conventional process is able to from a pillar having an aspect ratio of 1, a similar process may be used to form each tier 152, 154 of the pillar 150 thereby effectively obtaining an aspect ratio of 2. In this manner, pillars 150 of greater height than conventional pillars may be achieved without increasing the width of the pillars 150 and/or using more expensive processes to ensure the longer holes are completely filled with conductive materials (e.g., Cu, Ni, Al, Au, Ag, Pd, etc.).

Figure 3F:
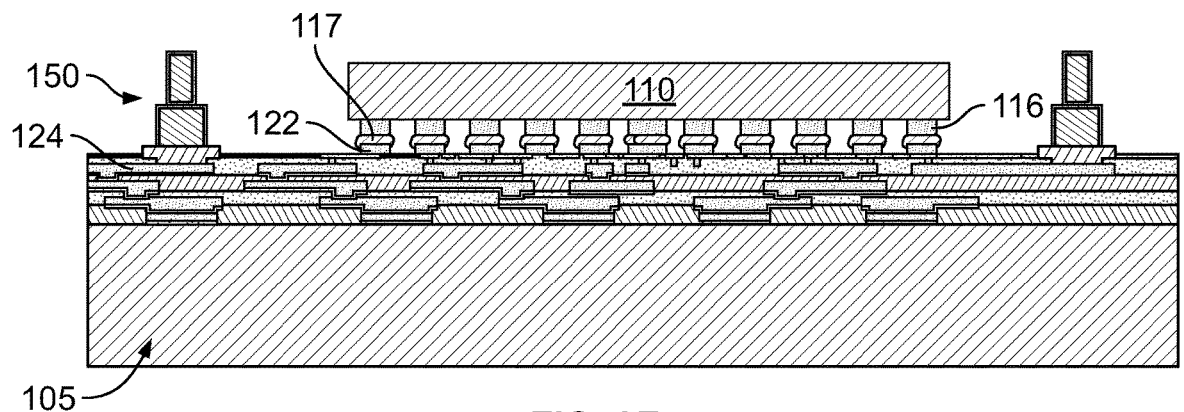

As shown in FIG. 3F, the layers 153, 157 may be removed and the semiconductor die 110 may be electrically connected to the pads 122. For example, each conductive bump 116 (or other conductive attachment structure) of the semiconductor die 110 may be electrically connected to a respective pad 122 through solder 117. The conductive bumps 116 of the semiconductor die 110 may be attached to the pads 122 in any of a variety of manners, non-limiting examples of which are presented herein.

For example, the conductive bumps 116 (or other conductive attachment structure, for example conductive pillar, etc.) of the semiconductor die 110 may be electrically connected to the pads 122 through the solder 117. In some embodiments, the term "bump" may collectively refer to a conductive bump or pillar 116 and solder 117 on the pillar 116. The conductive bump 116 of the semiconductor die 110 may be attached to the pads 122 in any of a variety of manners, non-limiting examples of which are presented herein. For example, the conductive bumps 116 may be soldered to the pads 122 utilizing any of a variety of solder attachment processes (e.g., a mass reflow process, a thermal compression process, a laser soldering process, etc.). Also for example, the conductive bumps 116 may be coupled to the pads 122 utilizing a conductive adhesive, paste, etc. Additionally for example, the conductive bumps 116 may be coupled to the pads 122 utilizing a direct metal-to-metal (e.g., solderless) bond. In an example scenario, a solder paste may be applied to the pads 122 utilizing a stencil and squeegee, the conductive bumps 116 of the semiconductor die 110 may be positioned on or in the solder paste (e.g., utilizing a pick-and-place process), and the solder paste may then be reflowed. After attachment of the semiconductor die 110, the assembly may be cleaned (e.g., with hot DI water, etc.), subjected to a flux clean and bake process, subjected to a plasma treatment process, etc.

As further depicted in FIG. 3F, the first tier 152 may have a height H1 that is greater than the combined height of the pads 122, solder 117, and connection structures 116. As such, an upper surface of the first tier 152 may be higher than a lower surface 113 of the semiconductor 110. Accordingly, the junction between the first tier 152 and the second tier 154 may fall within the height of the sidewall 115 of the semiconductor 110.

Figure 3G:
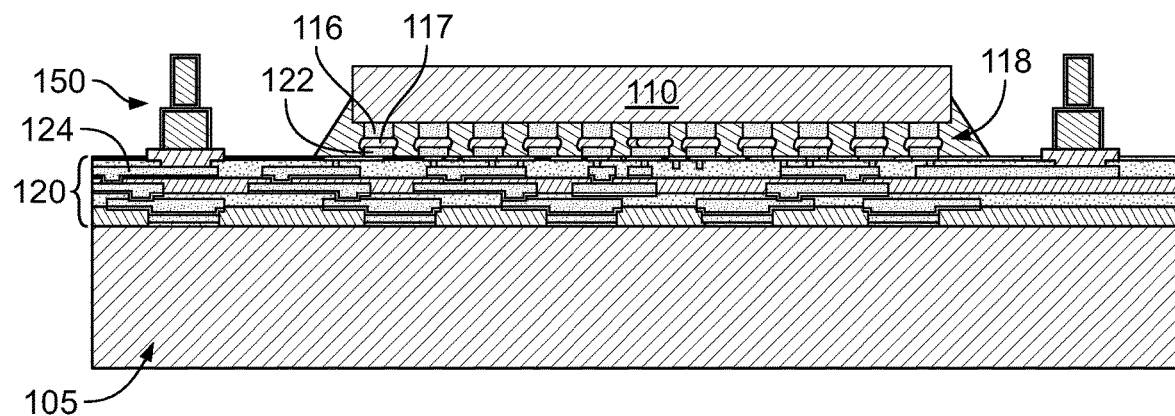

Referring now to FIG. 3G, an underfill 118 may be formed between the semiconductor die 110 and the interposer 120. The under fill 118 may surround and encapsulate portions of the conductive bumps 116 and pads 122 that are exposed to the underfill 118. The underfill 118 may comprise any of a variety of underfill materials. Also the underfill 118 may be formed utilizing any of a variety of processes (e.g., a capillary underfilling process, utilizing a pre-applied underfill material, etc.). The underfill 118 between the semiconductor die 110 and the first interposer 120 may prevent or reduce warpage due to, for example, thermal expansion coefficient differences between the semiconductor die 110 and the first interposer 120.

Figure 3H:
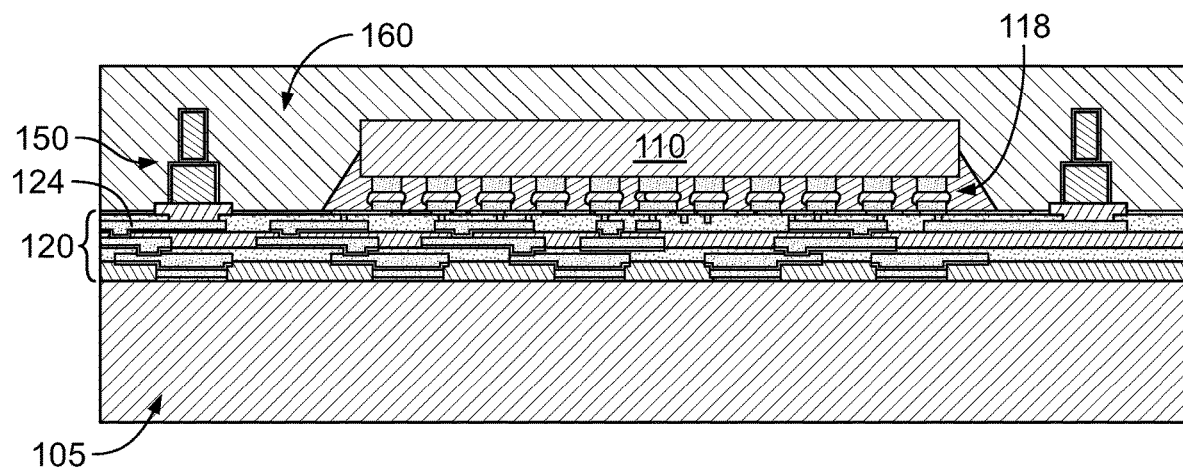

Then, as shown in FIG. 3H, the semiconductor die 110 and/or interposer 120 may be encapsulated with a mold material 160. The mold material 160 may comprise, for example, an encapsulant, molding resin, or other non-conductive material. Moreover, the mold material 160 may be cured in order to harden the mold material 160 and further protect the encapsulated semiconductor die 110. In an example implementation, the mold material 160 covers the pillars 150 and the semiconductor die 100 as shown.

The mold material 160 may be formed in any of a variety of manners (e.g., compression molding, transfer molding, flood molding, etc.). The mold material 160 may comprise any of a variety of types of mold material. For example, the mold material 160 may comprise a resin, an epoxy, a thermosetting epoxy molding compound, a room temperature curing type, etc.

When the size of a filler (e.g., in inorganic filler or other particle component) of the mold material 160 is smaller (or substantially smaller) than the size of a space or a gap between the first interposer 120 and the semiconductor die 110, the underfill 118 might not be utilized, and the mold material 160 may instead fill a space or gap between the first interposer 120 and the semiconductor die 110. In such an example scenario, the underfilling process and the molding process may be combined into a single molding process with a molded underfill.

Figure 3I:
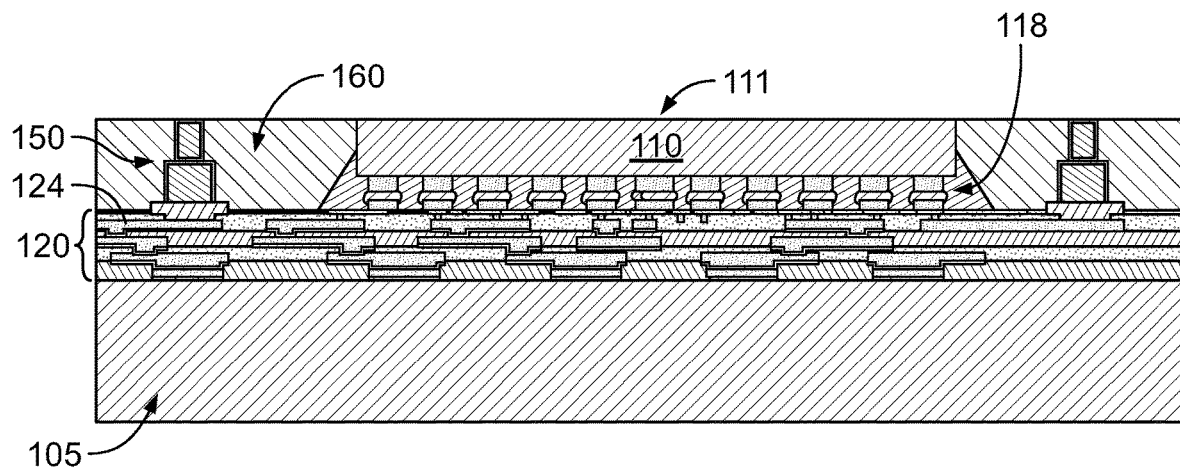

Referring now to FIG. 3I, the mold material 160, pillars 150, and semiconductor die 100 may be planarized via a mold-grinding process. In particular, a chemical/mechanical grinding process may be utilized to remove excess mold material 160. In particular, the mold-grinding process may form a planarized upper surface in which an upper surface of the mold material 160, upper surfaces of the pillars 150, and an upper surface of the semiconductor die 110 are coplanar. In another example implementation, the mold-grinding process may retain the mold material 160 over the upper surface of the semiconductor die 110. In particular, the mold-grinding process may form a planarized upper surface in which the upper surface of the mold material 160 and upper surfaces of the pillars 150 are coplanar. In such an embodiment, the pillars 150 may have a greater height to ensure the upper ends extend beyond an upper surface of the semiconductor die 110 are exposed by the mold-grinding process.

Figure 3J:
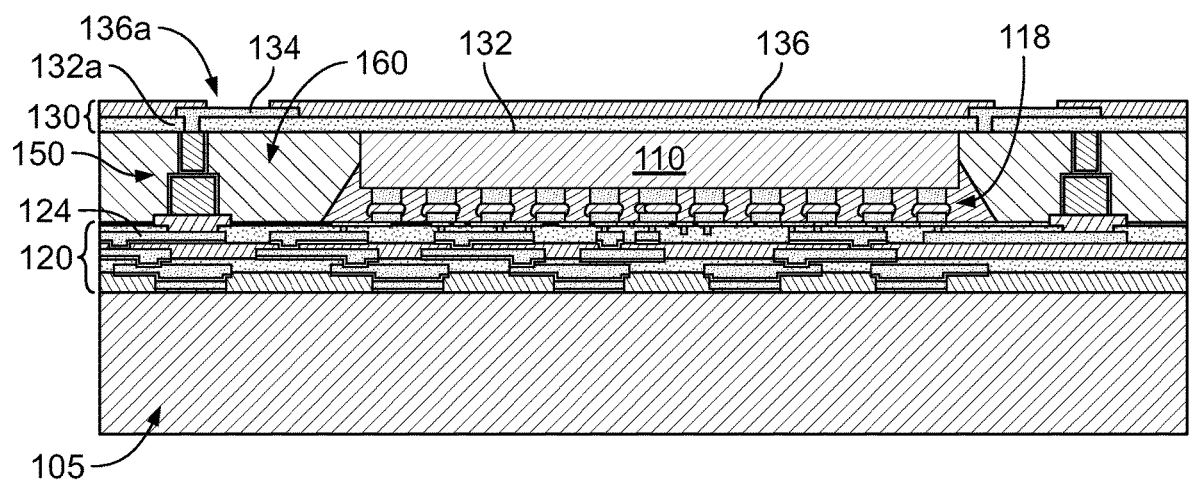

As shown in FIG. 3J, an upper surface of the mold material 160, semiconductor die 110, and/or the conductive pillars 150 may be covered with a first dielectric layer 132 of the second interposer 130. Also, openings 132a may be formed in the first dielectric layer 132 to expose tiered pillars 150. In one example implementation, a seed layer (not shown) may be formed at the inside of the openings 132a such as, for example, on side walls of the openings 132a formed in the first dielectric layer 132 and/or on the tiered pillars 150 exposed by the openings 132a. In addition to or alternatively, the seed layer may be formed outside of the openings 132a such as, for example, on the top surface of the first dielectric layer 132. As discussed herein, the seed layer may be formed using the same materials and/or processes as used to form the other seed layers, or may be formed using different respective materials and/or processes.

Continuing the example implementation, a conductive layer 134 of the second interposer 130 may be formed on the seed layer. For example, the conductive layer 134 may be formed to fill or at least cover side surfaces of the openings 132a in the first dielectric layer 132. The conductive layer 134 may be formed using the same materials and/or processes as the other conductive or redistribution layers, or may be formed using different respective materials and/or processes. The conductive layer 134 may also be referred to herein as a redistribution layer.

The conductive layer 134 may then be covered with a second dielectric layer 136 of the second interposer 130. The second dielectric layer 136 and/or the forming thereof may share any or all characteristics with other dielectric layers and/or the forming thereof discussed herein. Openings or apertures 136a may be formed in the second dielectric layer 136 to expose specific areas of the conductive layer 134 through such openings 136a. The openings 136a may be formed in any of a variety of manners such as, for example, mechanical and/or laser ablation, chemical etching, etc. Alternatively, for example, the second dielectric layer 136 may be originally formed with the openings 136a therein. A seed layer may be formed at the inside of the openings 136a and/or outside of the openings 136a. The seed layer and/or the forming thereof may share any or all characteristics with any other seed layer and/or the forming thereof discussed herein.

Figure 3K:
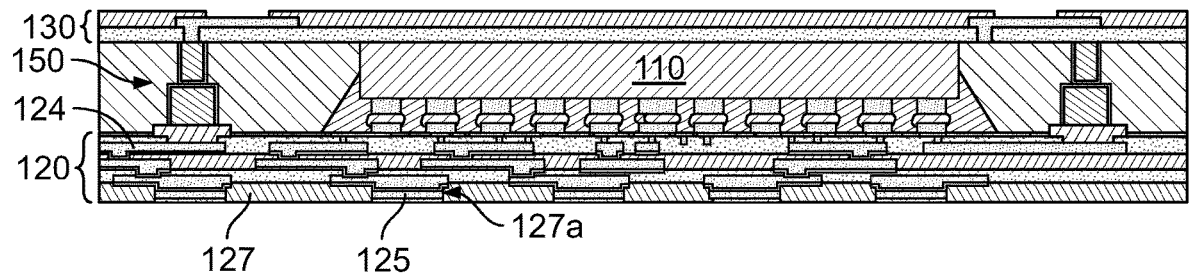

As shown in FIG. 3K, the carrier 105 may be removed from the under bump metal 125 and the first dielectric layer 127. For example, most or all of the carrier 105 may be removed through a mechanical grinding process. Any remaining carrier 105 may be removed through a chemical etching process. The removing of the carrier 105 may, for example, share any or all characteristics with any carrier removing discussed herein. In an example implementation, after removal of the carrier 105, the under bump metal 125 may be exposed through the openings 127a in the first dielectric layer 127. The bottom surfaces of the under bump metal 125 may be coplanar with the bottom surface of the first dielectric layer 127.

In some implementations, the carrier 105 may be attached to the first dielectric layer 127 and/or to the under bump metal 125 utilizing a temporary adhesive that loses it adhesion or a substantial portion thereof when exposed to thermal energy, laser or light energy, chemical agents, etc. The separation of the carrier 105 from the first dielectric layer 127 and/or under bump metal 125 may be performed by exposing the temporary adhesive to the energy and/or chemicals that cause the adhesive to loosen.

Figure 3L:
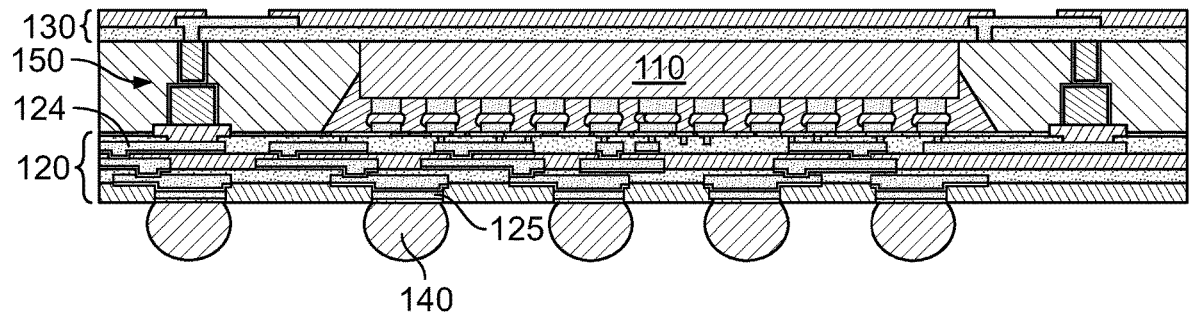

As further shown in FIG. 3L, the conductive interconnection structures 140 may be electrically connected to the exposed under bump metal 125. The conductive interconnection structure 140 may comprise any of a variety of characteristics, non-limiting examples of which are presented herein. For example, the conductive interconnection structure 140 may be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The conductive interconnection structures 140 and/or any conductive interconnection structure discussed herein may comprise a conductive ball (e.g., a solder ball, a copper-core solder ball, etc.), a conductive bump, a conductive pillar or post (e.g., a copper pillar, a solder-capped copper pillar, a wire, etc.), etc.

The conductive interconnection structure 140 may be connected to the under bump metal 125 utilizing any of a variety of reflow and/or plating processes. For example, volatile flux may be deposited (e.g., dotted, printed, etc.) on the under bump metal 125, the conductive interconnection structures 140 may be deposited (e.g., dropped, etc.) on the volatile flux, and then a reflow temperature of about 150° C. to about 250° C. may be provided. At this point, the volatile flux may be volatized and completely removed.

The conductive interconnection structure 140, as mentioned above, may be referred to as a conductive bump, a conductive ball, a conductive pillar, a conductive post, a conductive wire, etc., and may, for example, be mounted on a rigid printed circuit board, a flexible printed circuit board, a lead frame, etc. For example, the first semiconductor die 110 including the first interposer 120 may then be electrically connected (e.g., in a flip-chip form or similar to a flip-chip form, etc.) to any of a variety of substrates (e.g., motherboard substrates, packaging substrates, lead frame substrates, etc.).

Figure 3M:
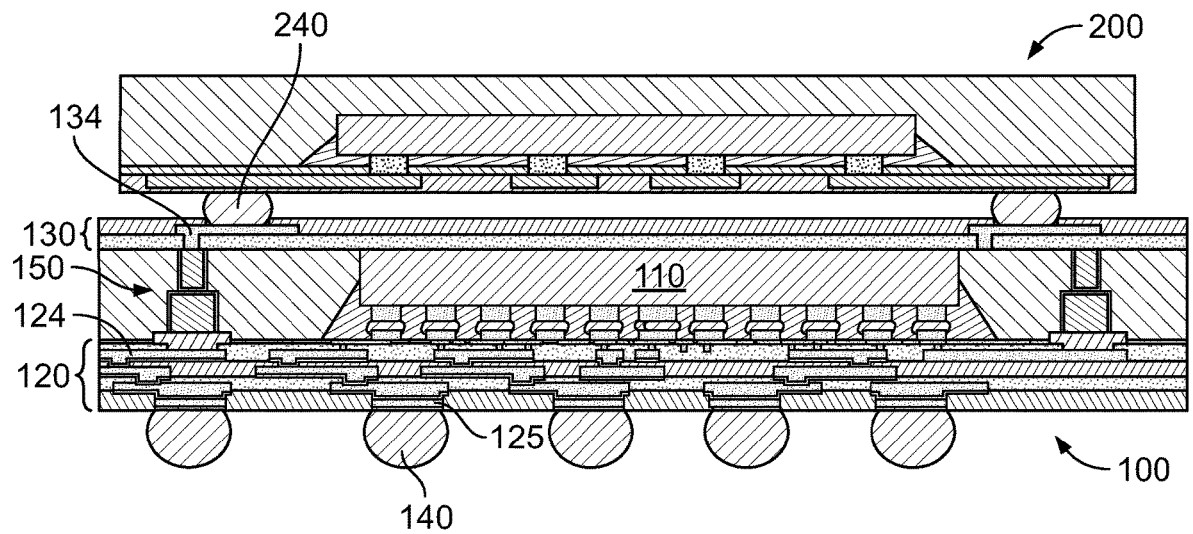

Finally, as shown in FIG. 3M, the second semiconductor device 200 is operatively coupled to the first semiconductor device 100. In particular, conductive interconnection structures 240 of the second semiconductor device 200 may be electrically connected to the conductive layer 134 of the second interposer 130 via openings 132a in the first dielectric layer 132.

While the foregoing has been described with reference to certain aspects and examples, those skilled in the art understand that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular examples disclosed, but that the disclosure includes all examples falling within the scope of the appended claims.

What is claimed is:

1. A semiconductor device, comprising:
a lower redistribution structure;
a first semiconductor die comprising a die upper side and a die lower side, the die lower side coupled to an upper side of the lower redistribution structure;
an upper redistribution structure comprising a lower side above the die upper side; and
a conductive pillar that couples the lower redistribution structure to the upper redistribution structurel, wherein:
the conductive pillar comprises a lower tier and an upper tier;
the upper tier comprises a lower end coupled to an upper end of the lower tier;
the lower tier comprises a lower end coupled to the upper side of the lower redistribution structure; and
a distance between the upper end of the lower tier and the upper side of the lower redistribution structure is greater than a distance between the die lower side and the upper side of the lower redistribution structure.

2. The semiconductor device of claim 1, wherein:
the first semiconductor die further comprises a die peripheral side that joins the die upper side to the die lower side; and
the conductive pillar traverses the die peripheral side.

3. The semiconductor device of claim 1, wherein:
the lower tier of the conductive pillar has a first width; and
the upper tier of the conductive pillar has a second width that is smaller than the first width.

4. The semiconductor device of claim 1, wherein an upper end of the upper tier is coupled to the upper redistribution structure.

5. The semiconductor device of claim 1, further comprising a second semiconductor die coupled to an upper side of the upper redistribution structure.

6. The semiconductor device of claim 1, further comprising bumps that couple the first semiconductor die to bump pads on the upper side of the lower redistribution structure.

7. The semiconductor device of claim 1, further comprising an underfill material that fills a region between the die lower side and the upper side of the lower redistribution structure.

8. The semiconductor device of claim 1, wherein the lower side of the upper redistribution structure contacts the die upper side.

9. The semiconductor device of claim 1, wherein a dielectric layer of the upper redistribution structure contacts the die upper side.

10. A semiconductor device, comprising:
a lower redistribution structure;
a first semiconductor die comprising a die upper side and a die lower side, the die lower side coupled to an upper side of the lower redistribution structure;

an upper redistribution structure comprising a dielectric layer having a lower side above the die upper side, a conductive layer on an upper side of the dielectric layer, and an opening in the dielectric layer that exposes a lower side of the conductive layer; and a conductive pillar that couples the lower redistribution structure to the upper redistribution structure, wherein:

the conductive pillar comprises a lower tier and an upper tier;

a lower end of the upper tier is coupled to an upper end of the lower tier; and an upper end of the upper tier contacts the lower side of the conductive layer exposed by the opening in the dielectric layer.

11. The semiconductor device of claim 10, wherein:

the lower tier of the conductive pillar has a first width; and the upper tier of the conductive pillar has a second width that is smaller than the first width.

12. The semiconductor device of claim 10, wherein a distance between the upper side of the lower redistribution structure and the upper end of the lower tier is greater than a distance between the upper side of the lower redistribution structure and the die lower side.

13. The semiconductor device of claim 10, wherein the conductive layer fills the opening in the dielectric layer.

14. The semiconductor device of claim 10, further comprising a second semiconductor die coupled to an upper side of the upper redistribution structure.

15. The semiconductor device of claim 10, further comprising bumps that couple the first semiconductor die to bump pads on the upper side of the lower redistribution structure.

16. The semiconductor device of claim 15, further comprising an underfill material that fills a region between the die lower side and the upper side of the lower redistribution structure.

17. A method of forming a semiconductor device, the method comprising:

coupling a lower side of a first semiconductor die to an upper side of a lower redistribution structure;

forming a lower tier of a conductive pillar such that a lower end of the lower tier is coupled to the upper side of the lower redistribution structure;

forming an upper tier of the conductive pillar such that a lower end of the upper tier is coupled to an upper end of the lower tier of the conductive pillar;

coupling an upper end of the upper tier to an upper redistribution structure, wherein the upper redistribution structure is above an upper side of the first semiconductor die; and at least one of:

forming the lower tier of the conductive pillar such that a distance between the upper end of the lower tier is and the upper side of the lower redistribution structure is greater than a distance between the lower side of the first semiconductor die and the upper side of the lower redistribution structure; or coupling the upper end of the upper tier to the upper redistribution structure such that the upper end of the upper tier contacts a lower side of a conductive layer of the upper redistribution structure, wherein the lower side of the conductive layer is on an upper side of a dielectric layer of the upper redistribution structure, and the dielectric layer has an opening that exposes the lower side of the conductive layer to the upper end of the upper tier.

18. The method of claim 17, comprising forming the lower tier of the conductive pillar such that the distance between the upper end of the lower tier and the upper side of the lower redistribution structure is greater than the distance between the lower side of the first semiconductor die and the upper side of the lower redistribution structure.

19. The method of claim 17, comprising coupling the upper end of the upper tier to the upper redistribution structure such that the upper end of the upper tier contacts the lower side of the conductive layer of the upper redistribution structure, wherein the lower side of the conductive layer is on the upper side of the dielectric layer of the upper redistribution structure, and the dielectric layer has the opening that exposes the lower side of the conductive layer to the upper end of the upper tier.

* * * * *